(12) United States Patent
Kumar et al.

(10) Patent No.: US 10,819,110 B2
(45) Date of Patent: Oct. 27, 2020

(54) ELECTROSTATIC DISCHARGE PROTECTION DEVICE

(71) Applicant: GLOBALFOUNDRIES INC., Grand Cayman (KY)

(72) Inventors: Anil Kumar, Clifton Park, NY (US); Manjunatha G. Prabhu, Clifton Park, NY (US); Alain F. Loiseau, Williston, VT (US); Mahbub Rashed, Cupertino, CA (US); Sushama Davar, Leander, TX (US)

(73) Assignee: GLOBALFOUNDRIES INC., Grand Cayman (KY)

(*) Notice: Subject to any disclaimer, the term of this patent is extended or adjusted under 35 U.S.C. 154(b) by 398 days.

(21) Appl. No.: 15/906,475

(22) Filed: Feb. 27, 2018

(65) Prior Publication Data
US 2019/0267801 A1    Aug. 29, 2019

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01); *H01L 27/0285* (2013.01)

(58) Field of Classification Search
CPC .. H02H 9/046; H01L 27/0266; H01L 27/0285
See application file for complete search history.

(56) References Cited

U.S. PATENT DOCUMENTS

| | | | |
|---|---|---|---|
| 6,369,994 B1 | 4/2002 | Voldman | |
| 6,650,165 B1* | 11/2003 | Mallikarjunaswamy | ................... H01L 27/0251 327/310 |
| 7,102,862 B1* | 9/2006 | Lien | ................... H01L 27/0285 361/56 |
| 7,593,201 B2* | 9/2009 | Ishizuka | ................ H01L 27/0251 361/111 |
| 7,719,813 B2* | 5/2010 | Chen | ..................... H02H 9/046 361/111 |
| 8,362,564 B2* | 1/2013 | Li | ................... H01L 21/76283 257/355 |
| 8,576,526 B2 | 11/2013 | Chu et al. | |
| 8,643,987 B2 | 2/2014 | Chu et al. | |
| 2004/0070901 A1* | 4/2004 | Umeda | ............... H01L 27/0266 361/56 |
| 2005/0040466 A1 | 2/2005 | Arai | |
| 2013/0057993 A1 | 3/2013 | Fukasaku | |

(Continued)

OTHER PUBLICATIONS

Taiwanese Office Action and Search Report in the related TW Application No. 107117561 dated Jan. 28, 2019, 6 pages.

(Continued)

*Primary Examiner* — Scott Bauer
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to electrostatic discharge (ESD) protection circuits and methods of use and manufacture. The structure includes: an electrostatic discharge (ESD) clamp which receives an input signal from a trigger circuit; and a voltage node connecting to a back gate of the ESD clamp, the voltage node providing a voltage to the ESD clamp during an electrostatic discharge (ESD) event.

20 Claims, 2 Drawing Sheets

(56) References Cited

U.S. PATENT DOCUMENTS

2014/0160604 A1    6/2014  Lai et al.
2017/0178704 A1    6/2017  Loiseau et al.
2018/0024187 A1    1/2018  Tatsumi

OTHER PUBLICATIONS

Taiwanese Office Action and Search Report in the related TW Application No. 107117561 dated Nov. 8, 2019, 10 pages.
German Office Action in the related DE Application No. 10 2018 208 547.1 dated Oct. 15, 2018, 14 pages.
Taiwanese Office Action issued in TW application No. 107117561 dated Apr. 21, 2020, 8 pages.

\* cited by examiner

ELECTROSTATIC DISCHARGE PROTECTION DEVICE

FIELD OF THE INVENTION

The present disclosure relates to semiconductor structures and, more particularly, to electrostatic discharge (ESD) protection circuits and methods of use and manufacture.

BACKGROUND

Electrostatic discharge (ESD) is the transfer of electrostatic charge between bodies at different electrostatic potentials (voltages). As is known, an ESD event can destroy and seriously impair IC devices, e.g., circuits used in handheld devices such as cellular telephones.

ESD protection devices are often built into IC devices in order to protect the various electronic components with the IC device. Providing ESD protection devices in handheld devices, e.g., cellular telephones, powered by battery are particularly challenging since these devices have to meet stringent power requirements.

RC-triggered power clamps (RC-Clamp) are typically used for ESD protection devices, particularly in handheld devices, e.g., cellular telephones. However, such clamps are large in size and also have high DC leakage, e.g., resulting in a gradual loss of energy. For example, the RC Clamp typically uses a very large transistor/FET, which provides ESD-current in a low resistive and controlled path to ground. In handheld devices, e.g., cellular telephones, leakage can also be problematic as it can drain the battery, amongst other problems. In SOI technologies, the performance of this large FET can be modulated by applying a bias to the region under the Buried OXide (BOX). This effect is particularly large in Fully Depleted SOI (FDSOI) technologies due to the thin BOX and is used in this disclosure.

SUMMARY

In an aspect of the disclosure, a structure comprises: an electrostatic discharge (ESD) clamp which receives an input signal from a trigger circuit; and a voltage node connecting to a back gate of the ESD clamp, the voltage node providing a voltage to the ESD clamp during an electrostatic discharge (ESD) event.

In an aspect of the disclosure, a structure comprises: an electrostatic discharge (ESD) clamp with a discharge FET which receives an input voltage from a trigger circuit; a first voltage node connecting to a back gate of the discharge FET, boosting its performance during an ESD event; and a second voltage node connecting to a back gate of the discharge FET, reducing its leakage during normal operation.

In an aspect of the disclosure, providing Vdd of an electrostatic discharge (ESD) to a back gate of a transistor of an ESD clamp during an ESD event; and providing a negative voltage to the back gate of the transistor of the ESD clamp and during normal operation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electrostatic discharge (ESD) protection circuits and methods of use and manufacture. More specifically, the present disclosure provides an RC-triggered power clamp used for ESD protection circuits. Advantageously, by implementing the circuits described herein, it is now possible to reduce the size of the ESD circuit, e.g., "big" transistor (NFET), by about 10%-15%, while also reducing leakage of the circuit, e.g., (1-2 orders of magnitude on the back gate) and still achieve adequate ESD protection (as in conventional ESD circuits).

In embodiments, the ESD circuit includes a capacitor or FET coupled to a back gate of the ESD clamp, e.g., big n-type FET. The ESD clamp is coupled to Vdd (at is back gate) during an ESD event and coupled to a negative voltage supply during normal operation. In embodiments, the capacitor or FET can be used to couple the back gate of the "big" transistor a trigger voltage, improving boost performance. By coupling the well of the ESD clamp to a trigger voltage, there will be no false coupling during normal power-up sequence. The improved performance of the FET can also be used to reduce total area needed for a same level of ESD protection as in a conventional ESD circuit.

Figure 1:
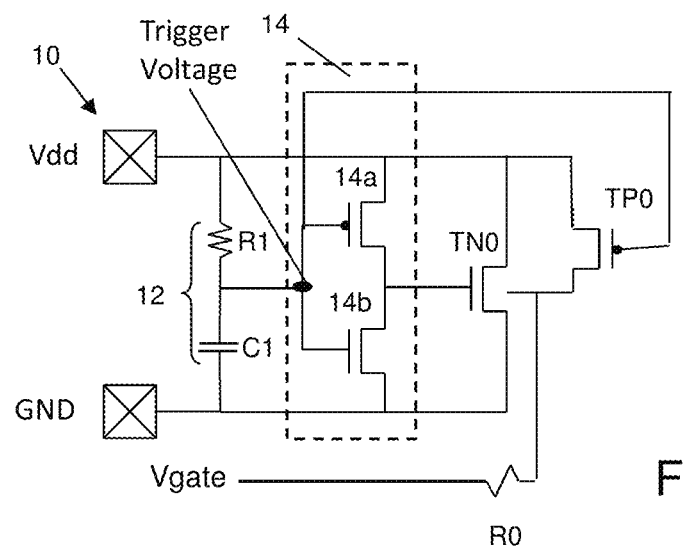
FIG. 1 shows a schematic of an electrostatic discharge (ESD) protection circuit in accordance with aspects of the present disclosure.

FIG. 1 shows a schematic of an electrostatic discharge (ESD) protection circuit in accordance with aspects of the present disclosure. As shown in FIG. 1, the circuit 10 (e.g., ESD clamping device) includes a timing circuit 12 for selectively turning ON the ESD clamp TN0, e.g., n-type FET, during an ESD event. In embodiments, the timing circuit 12 comprises a resistor R1 and capacitor C1 connected to Vdd (e.g., which can provide the trigger voltage or at which location an ESD event can occur) and GND (ground). Although FIG. 1 shows a resistor R1 at the top of the RC timing circuit 12 and a capacitor C1 at the bottom of the RC timing circuit 12, it is understood that this is for exemplary purposes only, and that the capacitor C1 may be at the top of the RC timing circuit 12 and the resistor R1 may be at the bottom of the RC timing circuit 12.

Still referring to FIG. 1, an output of the RC timing circuit 12 is coupled to a trigger circuit (inverter) 14 comprising a p-type FET 14a and a n-type FET 14b, in series. The trigger circuit (inverter) 14 is coupled between Vdd and GND. As should be understood by those of ordinary skill in the art, the trigger circuit 14 generates a trigger pulse for driving the ESD clamp TN0, e.g., turning on the ESD clamp TN0. Although FIG. 1 shows one (1) inverter, it is understood that the trigger circuit 14 may include any odd number of inverters, e.g., 3, 5, etc., resulting in the output signal of the trigger circuit 14 being opposite to its input signal, e.g., output of the RC timing circuit 12.

The ESD clamp 10 further includes a FET, TP0, e.g., p-type FET, connected to the trigger circuit 14 and to a back gate of the ESD clamp TN0. The ESD clamp TN0 is also connected to GND and a negative voltage source, Vgate, through an intervening resistor R0. It should be understood that the negative voltage source, Vgate, can be a negative bias generator provided at the system level. During operation, the negative voltage will be used to reduce the leakage of the ESD clamp TN0 as described in detail herein.

In operation and under normal conditions (e.g., when there is no ESD event), the output of the RC timing circuit 12 is charged high, e.g., "1" from Vdd. The output signal "1" is provided as an input (trigger voltage) to the inverter 14, e.g., p-type FET 14a and n-type FET 14b, which turns OFF the p-type FET 14a and turns ON the n-type FET 14b. The p-type FET TP0 will also be turned OFF, effectively blocking any Vdd to the back gate of the ESD clamp TN0. In addition, the ESD clamp TN0 will be turned OFF. During the OFF state of the ESD clamp TN0, a negative voltage will applied to its back gate by the negative voltage source, Vgate. The negative voltage will, in turn, reduce the leakage of the ESD clamp TN0. For example, as should be understood by those of ordinary skill in the art, the negative voltage will make the ESD clamp TN0 more resistive, hence reducing any leakage. In embodiments, the negative voltage can be about −1.5V; although other negative voltages are also contemplated herein.

During an ESD event, the capacitor C1 of the RC timing circuit 12 will not have time to charge, resulting in a low output signal "0". This low output signal "0" will be fed into the inverter trigger circuit 14, where the p-type FET 14a will turn ON and the n-type FET 14b will be turned OFF resulting in a high output signal "1". The high output signal "1" is then fed as an input to the ESD clamp TN0, e.g., n-type FET, which turns ON to discharge the ESD event to GND. Additionally, during the ESD event, the p-type FET TP0 will turn ON, allowing Vdd (e.g., ESD event) to pass to the back gate of the ESD clamp TN0, lowering the clamped voltage and effectively boosting the performance of the ESD clamp TN0. By way of example, for a 6 AMP current, it is possible to gain almost 4V clamping voltage with the forward biasing which also translates into a 10%-15% area savings compared to a conventional circuit.

Figure 2:
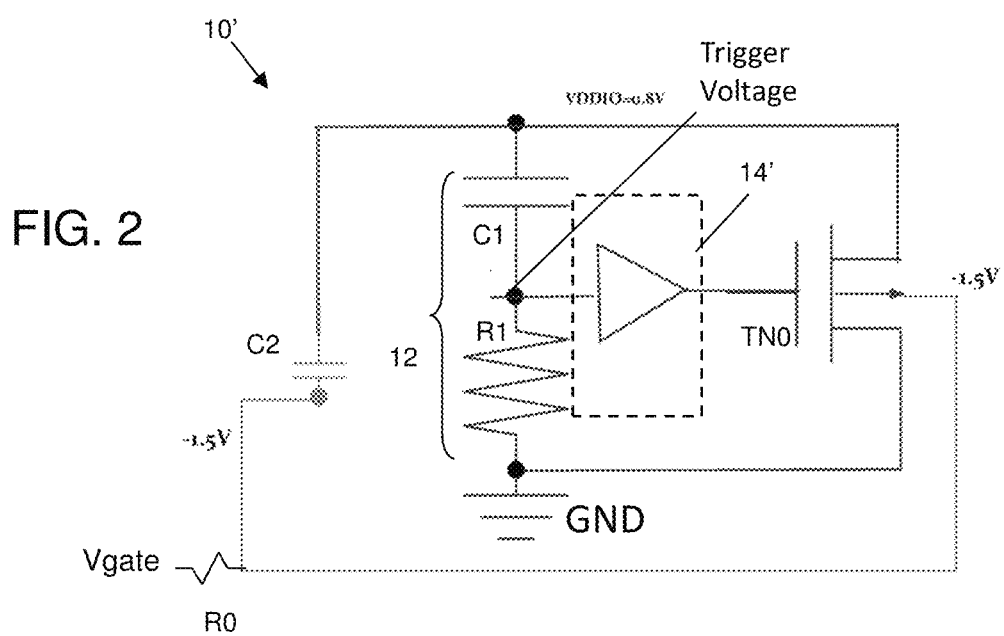
FIG. 2 shows a schematic of an ESD protection circuit in accordance with additional aspects of the present disclosure.

FIG. 2 shows a schematic of an ESD protection circuit in accordance with additional aspects of the present disclosure. As shown in FIG. 2, the circuit 10' (e.g., ESD clamping device) includes a capacitor C2 connected directly to Vdd, the back gate of the ESD clamp TN0, e.g., n-type FET, and the negative voltage source, Vgate. Vdd, in turn, is coupled to a backside of the ESD clamp TN0 and the RC timing circuit 12 (comprising capacitor C1 and resistor R1, in series) though capacitor C1. In this approach, the capacitor C2 can be used to couple the well (e.g., back gate) voltage of the ESD clamp TN0 during an ESD event.

Still referring to FIG. 2, in embodiments, the trigger circuit 14' comprises two inverters. Similar to the previous embodiment, each inverter of the trigger circuit 14' comprises a p-type FET and a n-type FET, in series. In this approach, the output of the trigger circuit 14' will be the same as its input, e.g., the output of the RC timing circuit 12. Although the trigger circuit 14' shown in FIG. 2 is representative of two (2) inverters, it is understood that the trigger circuit 14' may include any even number of inverters, e.g., 2, 4, etc., such that the output of the trigger circuit 14' is the same as its input, e.g., the output of the RC timing circuit 12.

In addition to connecting to Vdd on its back gate, the ESD clamp TN0 is also connected to GND and the negative voltage source, Vgate (on its back gate). In embodiments, the negative voltage source, Vgate, is connected to the back gate of the ESD clamp TN0 by the resistor R0. As previously described, it should be understood that the negative voltage source, Vgate, can be a negative bias generator provided at the system level. In in any of the embodiments described herein, the negative voltage can be about −1.5V; whereas, an ESD event at Vdd can be about 0.8 V. It should further be understood that other voltages are contemplated herein, where the negative voltage should be lower than GND.

In operation and under normal conditions (e.g., when there is no ESD event), the ESD clamp TN0 is turned OFF and both Vdd and a negative voltage are clamped to the back gate of the ESD clamp TN0, e.g., n-type FET. In this operational stage, the negative voltage, e.g., about −1.5V, applied to the back gate of the ESD clamp TN0, will reduce the leakage of the ESD clamp TN0 (and override any voltage of Vdd). The capacitor C2 will block the negative voltage from discharging to Vdd, i.e., decouple the negative voltage from the trigger voltage. The resistor R1 will also see 0 V on both its input side and output side, hence no leakage issues occur.

During an ESD event, on the other hand, the ESD clamp TN0 is turned ON. Also, the ESD charge applied to the capacitor C2 will discharge to the back gate of the ESD clamp TN0. In this way, the capacitor C2, being clamped to the back gate of the ESD clamp TN0, will forward bias the ESD clamp TN0 during the ESD event, effectively boosting its performance. The output of the ESD clamp TN0, during the ESD event, is drawn to GND.

Figure 3:
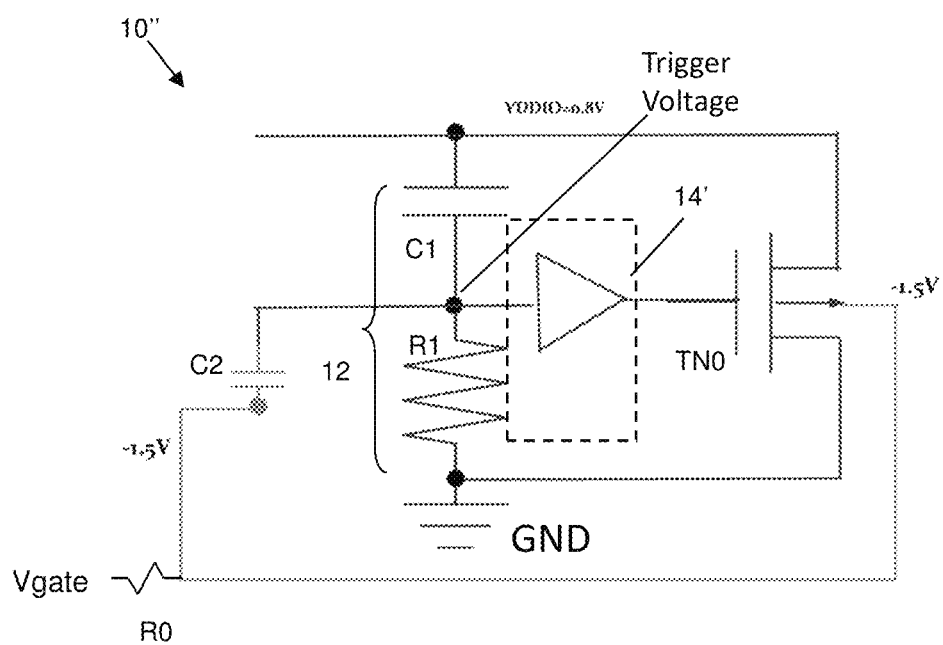
FIG. 3 shows a schematic of an ESD protection circuit in accordance with yet additional aspects of the present disclosure.

FIG. 3 shows a schematic of an ESD protection circuit in accordance with yet additional aspects of the present disclosure. In FIG. 3, the circuit 10" (e.g., ESD clamping device) includes a capacitor C2 connected to the trigger voltage and the back gate of the ESD clamp TN0. More specifically, the capacitor C2 is connected to Vdd (e.g., an ESD event), through the capacitor C1 of the timing circuit 12. The capacitor C2 is also connected to the negative voltage source, Vgate. The ESD clamp TN0 is also connected to GND and a negative voltage source, Vgate, by the resistor R0.

Still referring to FIG. 3, Vdd is coupled to a backside of the ESD clamp TN0 and the RC timing circuit 12 which comprises capacitor C1 and resistor R1, in series. In this embodiment, the trigger circuit 14' comprises two inverters, each of which comprises a p-type FET and a n-type FET, in series. As already described, the trigger circuit 14' may include any even number of inverters, e.g., 2, 4, etc., such that the output of the trigger circuit 14' is the same as its input, e.g., the output of the RC timing circuit 12.

In the embodiment of FIG. 3, during normal operations, the capacitor C2 will decouple the negative voltage from the trigger voltage. More specifically, in operation and under normal conditions (e.g., when there is no ESD event), the ESD clamp TN0 is turned OFF and Vdd is clamped to the back gate of the ESD clamp TN0. In addition, the negative voltage, e.g., about −1.5V will be applied to the back gate of the ESD clamp TN0, hence reducing the leakage of the ESD clamp TN0 (and override any voltage of Vdd). The resistor R1 will also see 0 V on both its input side and output side, hence no leakage issues occur.

During an ESD event, on the other hand, the ESD clamp TN0 is turned ON and a voltage from Vdd is clamped to the back gate of the ESD clamp TN0. In this way, the voltage applied to the back gate of the ESD clamp TN0 will forward bias the ESD clamp TN0 during the ESD event, effectively boosting its performance. Also, the capacitor C2, will improve (e.g., boost) the ON performance of the ESD clamp TN0 by turning on the back gate of the ESD clamp TN0 to clamp the voltage lower. In addition, the ESD event will discharge the voltage of the capacitor C2, and it being clamped to the back gate of the ESD clamp TN0, will forward bias the ESD clamp TN0 during the ESD event, effectively boosting its performance. The output of the ESD clamp TN0, during the ESD event, is provided to GND.

The ESD circuits of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD circuits of the present disclosure have been adopted from integrated circuit (IC) technology. For example, the structures are built on wafers and are realized in films of material patterned by photolithographic processes on the top of a wafer. In particular, the fabrication of the ESD circuits uses three basic building blocks: (i) deposition of thin films of material on a substrate, (ii) applying a patterned mask on top of the films by photolithographic imaging, and (iii) etching the films selectively to the mask. It should be recognized that the RC clamp (ESD clamp TN0) is built in SOI where the back gate under the BOX of the ESD clamp TN0 (e.g., bigFET) is connected to Vdd during ESD and connected to a low supply (lower than ground), e.g., negative voltage, during normal operation.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a trigger circuit comprising two transistors in series;
   an electrostatic discharge (ESD) clamp which comprises a first transistor and a second transistor, the first transistor is coupled to and receives an input signal from the trigger circuit at its gate to turn the first transistor ON or OFF; and
   a voltage node of the second transistor connecting to a back gate of the first transistor of the ESD clamp is turned ON during an ESD event and provides a voltage Vdd to the first transistor of the ESD clamp during the ESD event.

2. The structure of claim 1, further comprising a negative voltage source clamped to the back gate of the first transistor of the ESD clamp through a resistor, and which provides a negative voltage during normal operation.

3. The structure of claim 1, wherein the voltage node applied to the back gate of the first transistor is high during an ESD event and low during normal operation.

4. The structure of claim 3, wherein the first transistor comprises a n-type transistor, the second transistor is a p-type transistor connected to the back gate of the n-type transistor and, in the ON state of the p-type transistor, the voltage Vdd passes to the back gate of the n-type transistor.

5. The structure of claim 4, wherein, during normal operations, the p-type transistor is turned OFF and a voltage node provides a negative voltage to the back gate of the n-type transistor.

6. The structure of claim 1, further comprising a timing circuit connected to the voltage Vdd through a capacitor of the timing circuit and the voltage Vdd is connected to the back gate of the first transistor of the ESD clamp.

7. The structure of claim 6, wherein, upon an ESD event, the voltage Vdd is provided to the back gate of the first transistor of the ESD clamp through the second transistor.

8. The structure of claim 7, wherein, upon normal operations, the voltage Vdd is blocked and a negative voltage is clamped to the back gate.

9. The structure of claim 1, wherein the two transistors of the trigger circuit comprise a n-type transistor and a p-type transistor, in series, where the p-type transistor turns ON and the n-type transistor turned OFF during the ESD event, resulting in a high output signal "1" feeding into the first transistor of the ESD clamp.

10. The structure of claim 9, wherein, during the ESD event, the second transistor, which is a p-type transistor, turns ON, allowing the voltage Vdd of the ESD event to pass to the back gate of the first transistor, which is a n-type transistor, lowering a clamped voltage.

11. The structure of claim 10, further comprising a negative voltage source fed into the back gate of the first transistor and bypassing the second transistor.

12. The structure of claim 11, further comprising a resistor between the negative voltage source and the back gate of the first transistor.

13. The structure of claim 12, wherein the negative voltage reduces leakage of the first transistor under normal operations.

14. The structure of claim 13, further comprising a timing circuit comprising a capacitor and a resistor wherein, during the ESD event, the capacitor will not charge, resulting in a low output signal "0" fed into the trigger circuit, the p-type transistor turns ON and the n-type transistor turns OFF resulting in a high output signal "1" fed as an input to the first transistor of the ESD clamp, which turns ON to discharge the ESD event to GND.

15. The structure of claim 14, wherein during the ESD event, the second transistor turns ON, allowing the Vdd voltage of the ESD event to pass to the back gate of the first transistor lowering a clamped voltage.

16. A structure comprising:
   an electrostatic discharge (ESD) clamp with a discharge FET which receives an input voltage Vdd at a its gate from a trigger circuit to turn the discharge FET ON or OFF;
   a first voltage path comprising a transistor of a different type than the discharge FET and connecting to a back gate of the discharge FET, boosting its performance during an ESD event by the transistor turning ON and allowing the input voltage Vdd to pass to the back gate of the discharge FET; and a second voltage path connecting to the back gate of the discharge FET, reducing its leakage during normal operation.

17. The structure of claim 16, wherein the first voltage path is a p-type transistor which is ON during an ESD event thereby allowing the input voltage Vdd to pass to the back gate of the ESD clamp, and is OFF during normal operations.

18. The structure of claim 17, wherein, during the normal operations, the p-type transistor is turned OFF and the second voltage path provides a negative voltage to the back gate of transistor of the ESD clamp.

19. A method, comprising:
providing voltage Vdd of an electrostatic discharge (ESD) event to a back gate of a transistor of an ESD clamp during an ESD event, wherein the voltage Vdd is provided to the back gate of the transistor through a second transistor of a different type than the transistor; and
providing a negative voltage to the back gate of the transistor of the ESD clamp during normal operation.

20. The method of claim 19, wherein the voltage Vdd boosts performance of the transistor and the negative voltage reduces leakage of the transistor.

* * * * *